United States Patent [19]

Wickersham, Jr. et al.

[11] Patent Number: 5,234,487

[45] Date of Patent: Aug. 10, 1993

[54] METHOD OF PRODUCING TUNGSTEN-TITANIUM SPUTTER TARGETS AND TARGETS PRODUCED THEREBY

[75] Inventors: Charles E. Wickersham, Jr.; John J. Mueller, both of Columbus, Ohio

[73] Assignee: Tosoh SMD, Inc., Grove City, Ohio

[21] Appl. No.: 685,789

[22] Filed: Apr. 15, 1991

[51] Int. Cl.⁵ .......................... C22C 27/04; B22F 1/00
[52] U.S. Cl. .................................. 75/248; 75/235; 419/19; 419/23; 419/39; 419/49; 420/430
[58] Field of Search ............ 419/19, 23, 39, 49; 75/232, 235, 248; 420/430

[56] References Cited

U.S. PATENT DOCUMENTS

| | | | |
|---|---|---|---|
| 3,356,495 | 12/1967 | Zima et al. | 419/23 |
| 3,356,496 | 12/1967 | Hailey | 419/6 |
| 3,689,259 | 9/1972 | Hailey | 419/48 |
| 3,729,971 | 5/1973 | Gurganus et al. | 419/42 |
| 4,219,357 | 8/1980 | Yolton et al. | 419/48 |
| 4,331,476 | 5/1982 | Helderman et al. | 419/38 |
| 4,381,942 | 5/1983 | Blum et al. | 419/23 |
| 4,428,856 | 1/1984 | Boyarina et al. | 252/181.1 |
| 4,564,501 | 1/1986 | Goldstein | 419/25 |
| 4,619,695 | 10/1986 | Oikawa et al. | 75/65.10 |
| 4,663,120 | 5/1987 | Parent et al. | 419/10 |
| 4,673,549 | 6/1987 | Ecev | 419/10 |
| 4,714,587 | 12/1987 | Eylon et al. | 419/29 |
| 4,731,116 | 3/1988 | Kay | 75/238 |
| 4,746,363 | 5/1988 | DeAngelis | 75/244 |
| 4,750,932 | 6/1988 | Parent et al. | 75/228 |
| 4,770,948 | 9/1988 | Oikawa et al. | 428/664 |
| 4,838,935 | 6/1989 | Dunlop et al. | 75/230 |
| 4,931,253 | 6/1990 | Eylon et al. | 419/25 |
| 4,966,626 | 10/1990 | Fujiki et al. | 75/238 |

OTHER PUBLICATIONS

T. Brat et al., Proceedings 2nd ASM Int'l Elect. Materials & Processing Congress, Phila., Pa., Apr. 89, pp. 241-248.

E. Waterman et al, Proceedings of 7th IEEE VLSI Multilevel Interconnection Conf., Santa Clara, Calif., Jun. 90, pp. 329-331.

Massalski, Binary Alloy Phase Diagrams, vol. 2, ASM Int'l, Metals Park, Ohio, pp. 2136-2137.

L. V. Pavlinov, Fiz. Metal. i Metalloved. 24, 272 (1967).

Michael Hill, Magnetron Sputtered Titanium-Tungsten Films, Solid State Tech., Jan. 1980, pp. 53-59.

Rudy et al, Revision of the Titanium-Tungsten System, Trans. of the Metal. Soc. of AIME, vol. 242, May 68, pp. 953-954.

Yamauchi et al, Development of W-Ti Binary Alloy Sputtering Target and Study of its Sputtering Characteristics, Nippon Tungsten Review, vol. 22 (2989), pp. 55-72.

Primary Examiner—Donald P. Walsh
Assistant Examiner—Ngoclan T. Mai
Attorney, Agent, or Firm—Biebel & French

[57] ABSTRACT

Tungsten-titanium sputter targets of at least 95% theoretical density are provided with little or no β(Ti, W) phase constituent. Such targets will minimize troublesome particulate emissions during sputter coating conditions.

18 Claims, 4 Drawing Sheets

METHOD OF PRODUCING TUNGSTEN-TITANIUM SPUTTER TARGETS AND TARGETS PRODUCED THEREBY

FIELD OF THE INVENTION

The invention relates to a method of making tungsten-titanium alloy sputtering targets and to the targets produced thereby. The targets exhibit decreased particulate ejection therefrom during sputter coating procedures.

BACKGROUND OF THE INVENTION

Interest in reducing the emission of undesirable particulates from sputter targets has increased over the last few years. For example, one study[1] of the subject deals with the effect of target impurity composition and density on the film resistivity, C-V shift and leakage performance. Particle emission effects were not directly measured in this work.

[1]T. Brat, D. Pramanik, J. E. Poole and C. E. Wickersham, Jr., Proceedings 2nd ASM International Electronic Materials and Processing Congress, Philadelphia, Pa., April 1989, pp. 241-248.

Waterman et al[2] were first to link target manufacturing processes to particle emission and defect densities on sputter coated wafers. They found that the target manufacturing method had a strong influence on the particle density and the device yield. Their explanation for the result was that oxygen content and "void pressure" in the different targets was partly responsible for the observed results. All targets used in the paper by Waterman et al[2] had a microstructure of some combination of $\beta(Ti,W)$, a Ti rich phase and a W rich phase. They failed to link directly the particulate emission performance of the targets with the target microstructure. Furthermore, their theory suggests that lowering the processing pressure will result in a lower "void pressure" and thus a lower level of particulate emission.

[2]E. Waterman, J. Dunlop, and T. Brat, Proceedings of the 7th IEEE VLSI Multilevel Interconnection Conference, Santa Clara, Calif., June 1990, pp. 329-331.

U.S. Pat. No. 4,838,935 (Dunlop et al) teaches that "voids" in tungsten-titanium targets result in increased "particulates" during sputter coating. Improved targets are purportedly prepared by powder metallurgical techniques using titanium hydride powder or mixtures of titanium power and titanium hydride along with the tungsten powder. Compaction of the powders is effected at a temperature of at least 1350° C. with an optimum temperature range given as 1375°-1450° C. Below this critical temperature range, the patent indicates that the resulting target will not possess the requisite density. Pressure in the range of about 2,000 to 5,000 psi (14 MPa to 34 MPa) is applied to the die.

U.S. Pat. Nos. 4,931,253 (Eylon et al) and 4,714,587 (Eylon et al) teach HIPing (hot isostatic pressing) of titanium alloys at temperatures close to the $\alpha Ti$-$\beta Ti$ phase transformation temperature so that the $\alpha Ti$-phase is retained in the finished part. The process reputedly results in fine grain structure and improved mechanical properties. No mention is made of sputter target formation or sputtering in general.

SUMMARY OF THE INVENTION

Contrary to the prior art teachings referred to above, we have found that decreased particulate emission from W-Ti alloy targets can be achieved by providing W-Ti sputter targets having substantially zero $\beta(Ti,W)$ phase in the target structure.

$\beta(Ti,W)$ is a solid solution of BCC (Body Centered Cubic) W and Ti. This phase forms by interdiffusion of W into Ti during high temperature processing of W-Ti target materials. $\beta(Ti,W)$ is very hard and brittle (hardness Rockwell C50). We have found that this phase is a major source of target particle emission during W-Ti alloy target sputtering. By manufacturing W-Ti targets so that substantially zero $\beta(Ti,W)$ phase forms in the alloy, particulate emission from the target during cathodic sputtering can be decreased.

Additionally, current practice in the W-Ti sputtering field is to limit the power applied to the target during sputtering so that the target temperature remains low and the thermal stress on the target is minimized. This propensity for target fracture is related to the significant amounts of $\beta(Ti,W)$ phase present in the target. One advantage of the present invention, wherein the sputter targets comprise substantially zero $\beta(Ti,W)$ in the alloy structure, is that the targets can be used in the sputtering process at significantly higher sputtering powers than the previous W-Ti sputtering targets. High sputtering powers will result in higher target operating temperatures. In this regard, however, and as shall be explained hereafter, during sputtering, care should be taken to ensure that the target does not reach a temperature equal to or exceeding the $\alpha Ti$-$\beta Ti$ transition temperature or the W-Ti monotectoid temperature.

The invention will be further described in conjunction with the following detailed description read in view of the appended drawings.

DETAILED DESCRIPTION

This invention relates to the manufacture of W-Ti and W-Ti based alloy sputter targets. The resulting targets have little or minimum $\beta(Ti,W)$ phase present and, accordingly, when used under sputter coating conditions, the propensity of the target to emit undesirable particles will be minimized.

In accordance with the invention, W-Ti sputter targets comprising from about 1%-20% wt. Ti can be provided that contain substantially no $\beta(Ti,W)$ phase. By the phase "substantially no $\beta(Ti,W)$ phase", we mean from about 15% (by volume) or less $\beta(Ti, W)$. W-Ti targets in accordance with the invention preferably comprise from trace to 12% by volume of undesirable $\beta(Ti, W)$, with the most preferable targets comprising from trace to 10% by volume β(Ti,W). These targets have a density of about 95% of the theoretical density or greater.

Figure 1A:
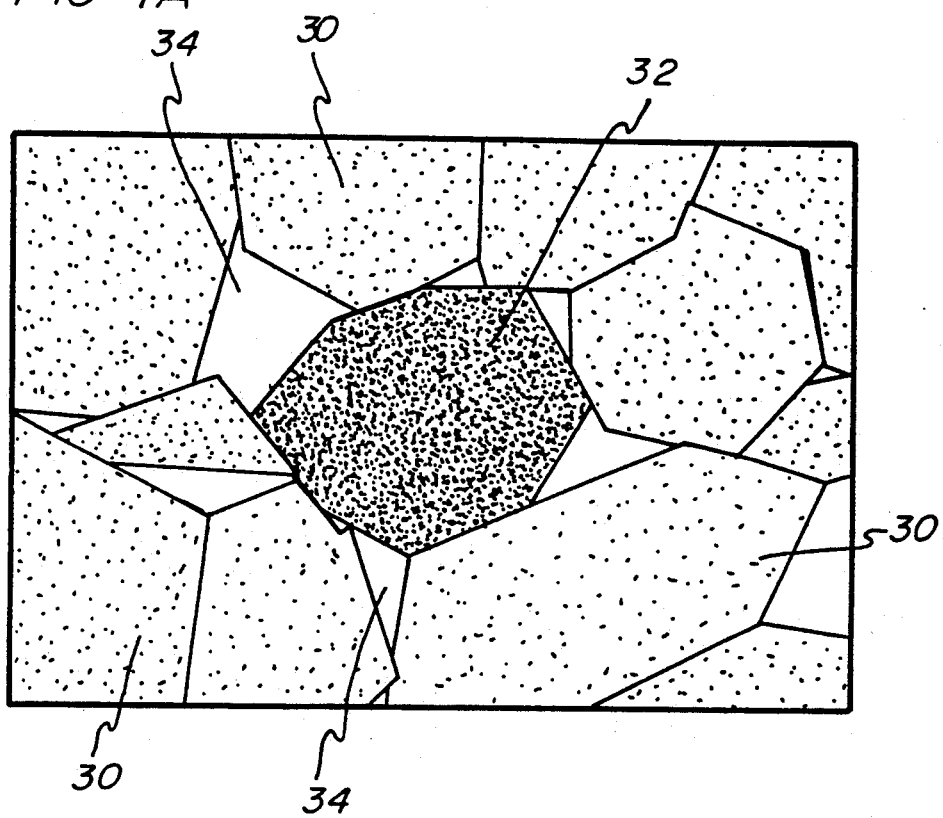
FIG. 1a is a schematic diagram showing W and Ti grains before traditional compaction and heat treatment.

The undesirable β(Ti,W) phase is a solid solution of BCC (Body Centered Cubic) W and Ti. This phase is thought to form by the interdiffusion of W into Ti during the heretofore conventional high temperature processing of W-Ti target materials. W-Ti alloys (1 to 50 vol. % Ti) have microstructure similar to that shown in the diagrammatic depictions shown in FIGS. 1a and 1b. Prior to high temperature processing, the W-Ti target preform is composed of Ti powder grains surrounded by W powder grains. This preform configuration can be seen in FIG. 1a wherein W powder grains 30 surround the Ti powder grains 32, with void regions 34 existing in the regions between sides of contiguous W grains and W and Ti grains.

Figure 1B:
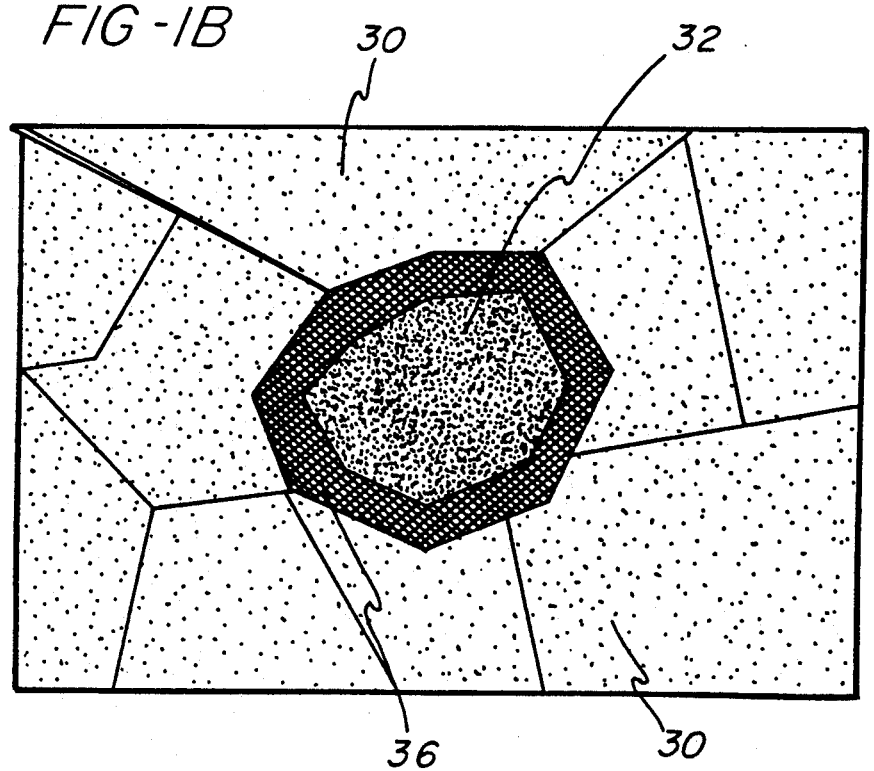
FIG. 1b is a schematic similar to FIG. 1 after traditional compaction and heat treatment showing the formation of undesirable $\beta(Ti,W)$ phase.

After conventional compaction and heat treatment, as shown in FIG. 1b, the W powder grains 30 compact into a fully dense W matrix surrounding isolated Ti grains 32. β(Ti,W) phase solid region 36 is formed surrounding the Ti grains 32. Although applicants are not to be bound to any particular theory of operation, it is thought that this β(Ti,W) phase is a hard, brittle phase that has heretofore, resulted in increased particulate emission during sputtering.

Figure 2:
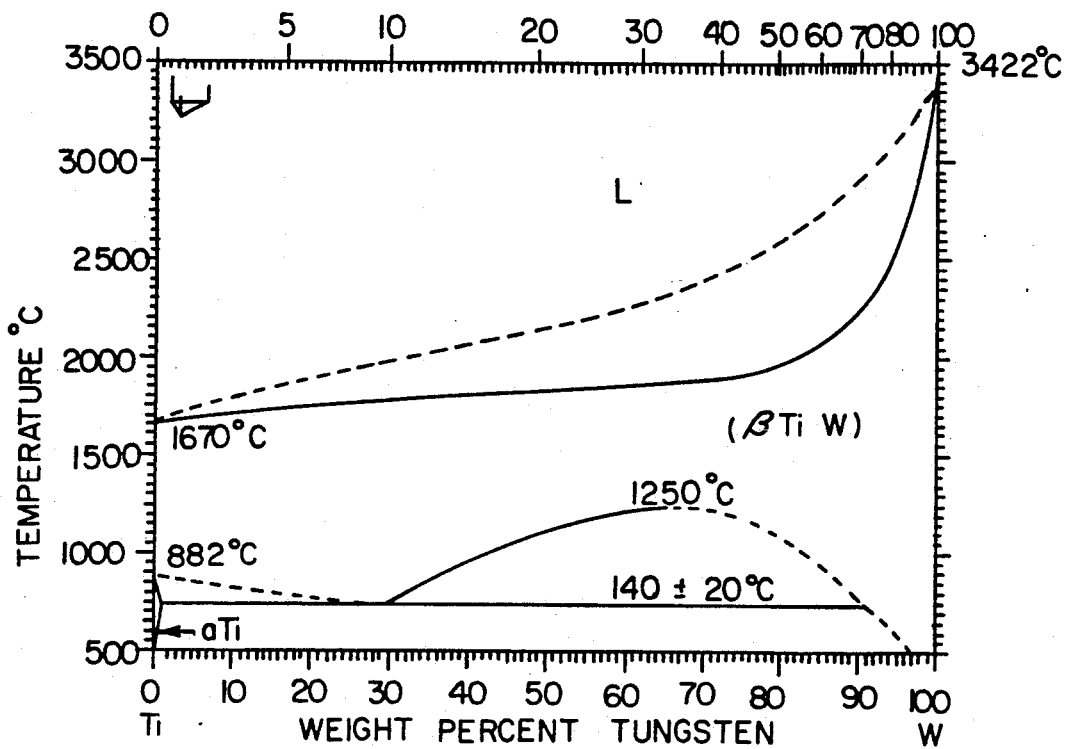
FIG. 2 is a binary alloy phase diagram for W-Ti alloy.

The phase diagram for W-Ti shown in FIG. 2 and taken from Massalski, Binary Alloy Phase Diagrams Vol. 2, Ed. T. B. Massalski, ASM International, Metals Park, Ohio, pp. 2136-2137, indicates that in order to avoid formation of the β(Ti,W) phase during processing of W-Ti alloys the processing temperature should be equal or below the monotectoid temperature of 740°±20°C. Accordingly, one method of reducing the formation of β(Ti,W) in a sputter target is to manufacture and use the part in a manner that prevents the target temperature from exceeding this monotectoid temperature.

Figure 3:
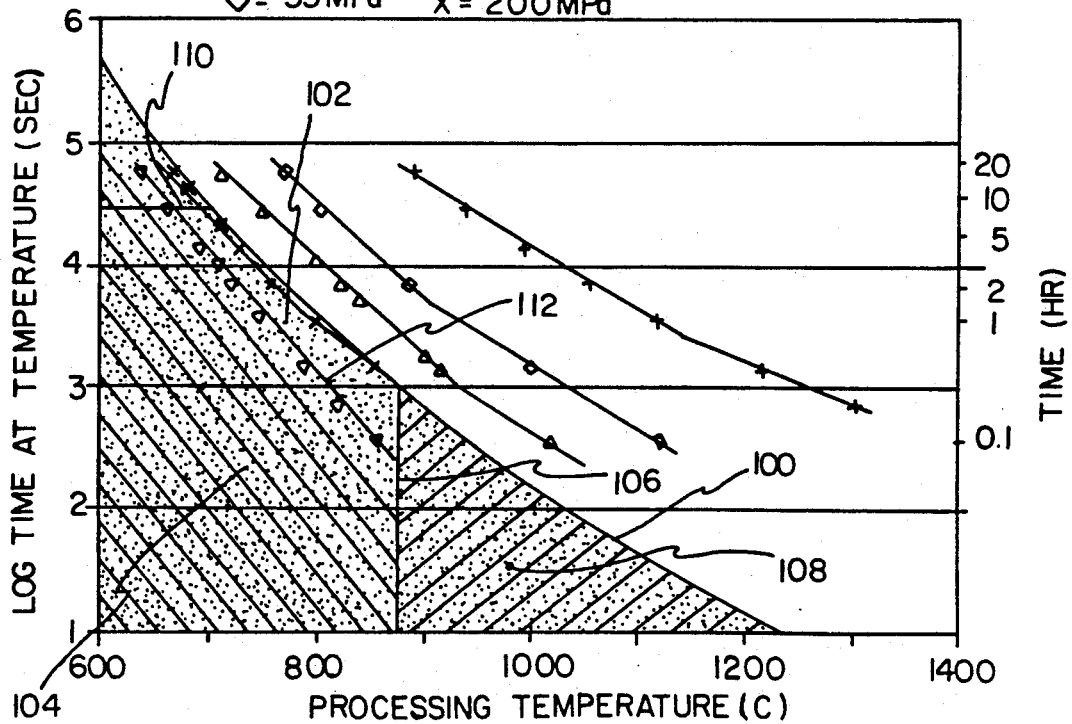
FIG. 3 is a process simulation map illustrating process conditions for formation of W-Ti targets in accordance with the invention.

FIG. 3 shows a compaction process simulation map for a W-10 Ti alloy. Our method for avoiding the formation of β(Ti,W) phase during the elevated temperature compaction of W-Ti powders can be seen using this figure. This figure shows the processing temperature and time required to form W-10 Ti powder into a 95% dense target using compaction pressures of 0, 33, 100, 200, and 300 MPa. Also shown in FIG. 3 is the diffusion limit curve 100 for W diffusion into the Ti grains. To avoid forming significant amounts of β(Ti,W) phase during target manufacture, the manufacturing conditions must be maintained at temperatures and times below the diffusion limit curve in the region 104 in order to result in W-Ti targets having the desired properties. Processing conditions above the diffusion limit curve (upper right of line 100, FIG. 3) or to the right of α-βTi transformation temperature line 106 (in region 108) will result in a 95% dense W-Ti target, but significant amounts of deleterious β(Ti,W) will form during the process.

From FIG. 3, it can be seen that targets with greater than 95% density can be formed by compaction at pressures equal or greater than 200 MPa. Sputtering targets so formed should preferably be cooled during usage in the sputter coating process so that they do not attain temperatures of 740°±20° C. Preferably, process conditions should be within envelope 102 bordered by diffusion line 100, α-β Ti transformation line 106, maximum time line 110 and the curved line 112.

To aid in preventing formation of β(Ti,W) phase, the Ti powder size should be as large as possible. Table I lists the ranges of processing parameters that can be used to manufacture a target within the desired β(Ti,W) range.

TABLE I

|  | Operable | Preferred | Most Preferred |
|---|---|---|---|
| Temperature(c) | 882° C. to 600° C. | 850° C.-650° C. | 800-700° C. |
| Pressure (MPa) | 200-1,000 MPa | 200-400 MPa | 300 MPa |
| Time (Hr) | 0.1-5 hours | 1-3 hours | 2 hours |
| Ti Powder Size | 44 um-1,000 um | 100-300 um | 150 um |

The above processing conditions can be accomplished by hot isostatic pressing (HIPing) or by the CERACON process as specified in U.S. Pat. Nos. 3,356,496 (Hailey) or 3,689,259 (Hailey). Other compaction methods can be used providing that the desired densification of the target (i.e., ≈95% theoretical density) can be achieved without moving outside of the operable envelope shown in FIG. 3 or the parameters given in Table I.

In conventional HIPing procedures, the metallurgical powder is hermetically sealed within a flexible, airtight, evacuated chamber. The powders are then subjected to elevated temperatures with equal pressure applied from all sides. The pressure is typically transmitted by a pressurizing inert gas, usually argon. See, for example, U.S. Pat. No. 4,673,549 (Ecer) hereby incorporated by reference.

Although HIPing processing is presently preferred, the so-called Ceracon processes can also be employed. In these processes, a heated preform is surrounded by hot granular material capable of transmitting pressure in a pseudo-uniform manner with the entire assembly then being compacted in a conventional hydraulic press. For conventional Ceracon process parameters, attention is directed to U.S. Pat. Nos. 3,356,496 and 3,689,259 (Hailey), hereby incorporated by reference.

Following the above heat treatment-compaction steps, the near net size target shapes may be machined into the final desired target configuration.

EXAMPLES

The following examples are illustrative of the invention and should not be construed to limit the scope thereof.

EXAMPLE ONE

The goal of this experiment was to determine which variables in the target manufacturing process affected target particle emission during sputtering. To accomplish this task six W-10Ti sputtering targets were manufactured with different target microstructures and purity. These targets were used to deposit 220 nm thick films of W-Ti onto bare silicon wafers. The particle density on the W-Ti coated silicon wafers was measured and related to the target microstructure.

Table II lists some W-10Ti target properties and the HIP (Hot Isostatic Pressing) processing conditions used to manufacture these targets. W-10Ti temperature ranged from 1550° C. to 775° C. HIPing pressures of 100 MPa and 300 MPa were used. Each conical magnetron W-10Ti sputtering target listed in Table II was machined to fit a Varian 3180 sputtering source.

Each W-10Ti target was used to deposit 220 nm thick W-Ti films on several thousand 125 mm diameter silicon wafers. These sputter depositions were carried out in a modified Varian 3280 sputtering system with a Varian Conmag 3180 source. The sputtering conditions are listed in Table II. Argon sputtering pressure was 0.8 Pa (6 mTorr). Sputtering power ranged from 2.4 to 2.78 kW (9.5 to 11.0 W/cm$^2$). W-Ti film deposition times ranged from 50 to 64 seconds. We used a constant W-Ti film thickness of 220 nm in these experiments. External substrate heating was not used during the depositions.

Figure 4:
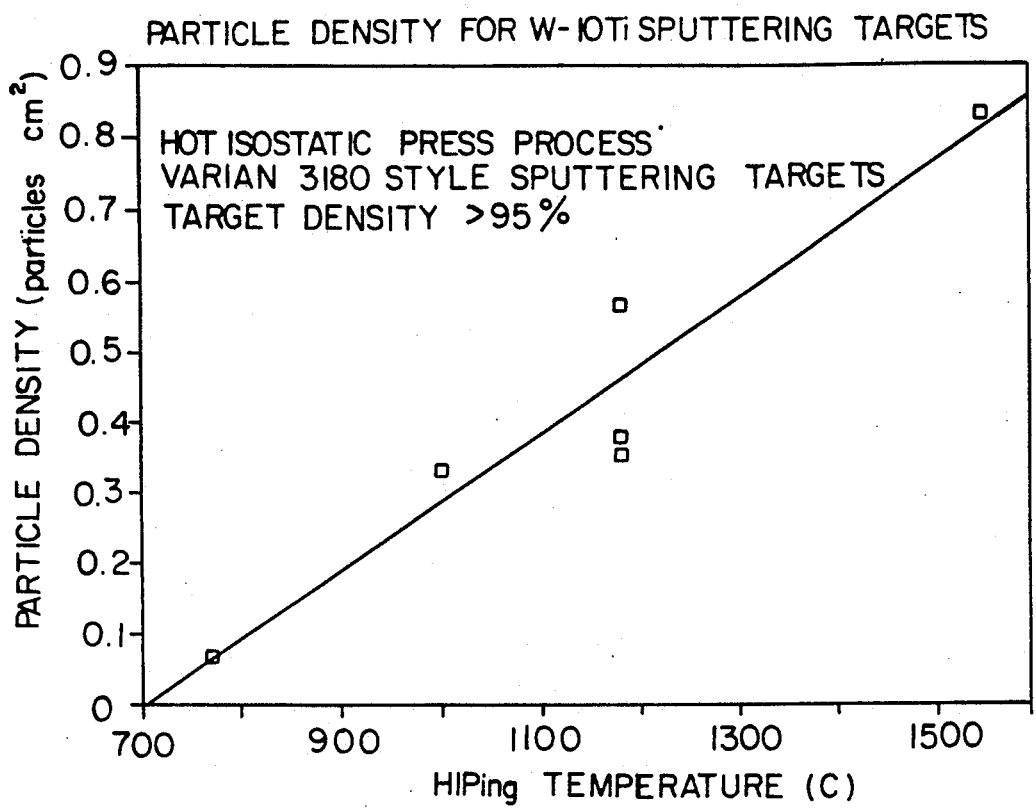
FIG. 4 is a graph showing target processing temperature versus particle density on coated wafers.
Figure 5:
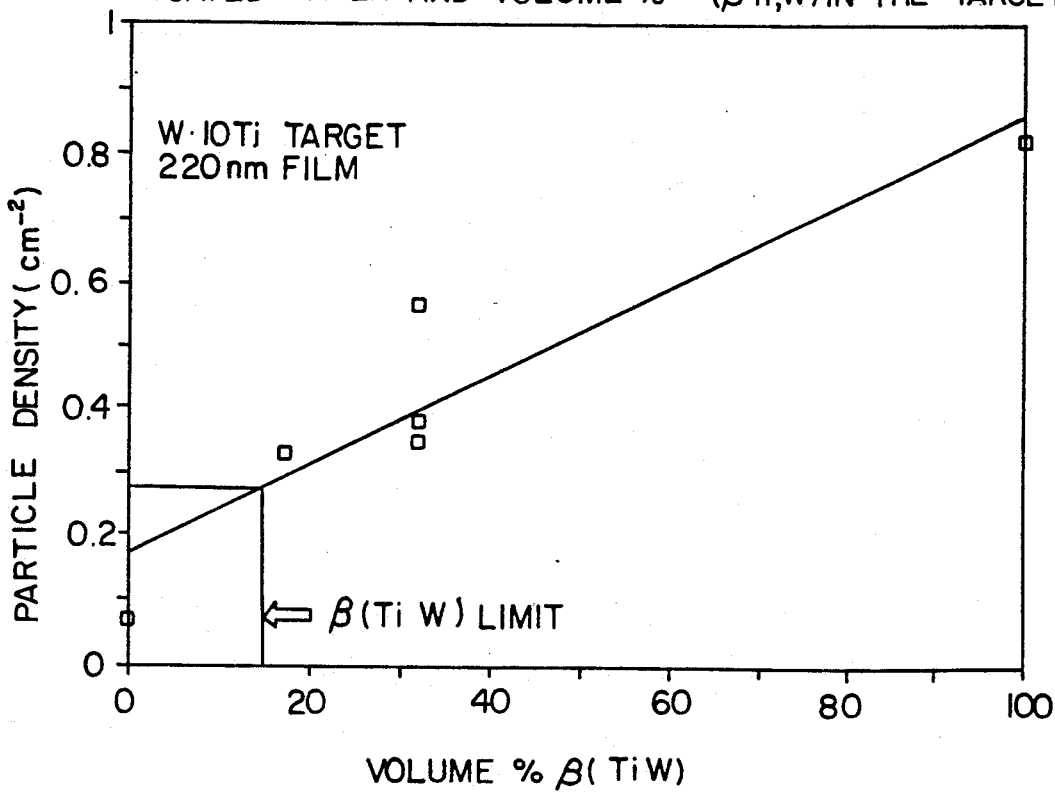
FIG. 5 is a graph showing $\beta(Ti,W)$ content in the targets versus particle density on wafers sputter coated by the targets.

Particle density on the 125 mm diameter W-Ti coated silicon wafers was determined with a Tencor 4500 surface particle counter. Bare silicon wafers were automatically fed into the sputtering system from a 25 wafer cassette. The 24th and 25th wafer in each cassette were designated as the particle count wafers. These wafers were placed in the cassette immediately after obtaining a wafer background count by running the bare wafer through the Tencor 4500 surface particle counter. Wafer background particle counts averaged 0.02 particles/cm$^2$. Each particle count wafer was a new wafer with no cleaning prior to insertion into the sputtering system. All other wafers were cleaned and reused after each W-Ti deposition. After the particle count wafer was coated with 220 nm of W-Ti, it was removed from the sputtering system, placed in the Tencor 4500 particle count system and the coated wafer particle count was measured. Particle density was determined by subtracting the wafer background particle count from the coated wafer particle count and dividing by the scan area. The particle counts were made with an outer 7.5 mm-wide edge exclusion annulus. Total wafer area used for particle counting was 91.9 cm$^2$. These activities took place in a Class 100 clean room. Average particle count in the clean room was typically 85 particles 0.5$\mu$m or greater in one cubic foot of air. FIG. 4 is a graphical representation of the resulting data showing the relationship between HIPing temperature and particle density on substrates sputter coated with the targets manufactured as per above. FIG. 5 is a graphical representation showing the relationship between the amount of $\beta$(Ti,W) in the target (vol.%) and particle density on sputtered substrates.

Results are shown in the Table II.

TABLE II

| Target | C | E | A | B | D | F |
|---|---|---|---|---|---|---|
| Temperature (C.) | 1550 | 1180 | 1000 | 1180 | 1180 | 775 |
| Pressure (MPa) | 100 | 100 | 100 | 100 | 100 | 300 |
| Time (Hr) | 2 | 2 | 2 | 2 | 2 | 2 |
| Ti Powder Size (um) | 44 | 44 | 44 | 44 | 44 | 44 |
| Density (g/cm$^2$) | 14.08 | 14.23 | 14.52 | 14.37 | 14.23 | 14.48 |
| (% theoretical) | 96.6% | 99.3% | 99.0% | 98.6% | 99.3% | 99.7% |
| Particles Deposited via Sputtering (cm-2) | 0.83 | 0.57 | 0.33 | 0.38 | 0.35 | 0.07 |

The importance of the results shown in Table II resides primarily in the fact that the particles deposited via sputtering increase as the target compaction temperature increases. The attached FIG. 4 shows this relationship graphically. The cause of this effect is shown in FIG. 5 to be related to the amount of $\beta$(Ti,W) found in the sputtering target. As shown in FIG. 5, a strong correlation is found between the volume % $\beta$(Ti,W) and the number of particles deposited via sputtering.

A similar relationship is found between the hardness of the target and the number of particles deposited via sputtering. As the target hardness increases the number of particles deposited via sputtering also increases. The $\beta$(Ti,W) phase is known to be very hard and brittle. Increasing the amount of $\beta$(Ti,W) in the target will act to increase the target hardness and brittleness.

The compaction pressure in Table II is increased from 100 MPa to 300 MPa when the compaction temperature is reduced from 1000° C. to 775° C. This increase in compaction pressure at the lower temperature is required to obtain a fully dense target. An important result of this experiment is that a lower number of particles deposited via sputtering is achieved when this higher compaction pressure is used.

The data shown in FIG. 5 allows us to establish the upper acceptable limit for $\beta$(Ti,W) phase in a W-Ti sputtering target. In order to show measurable reduction in the number of particles deposited via sputtering over the prior art, the volume % $\beta$(Ti,W) in the sputtering target must be equal to or less than 15%. At this level, the particle density is expected to be around 0.25 particles/cm$^2$. Particle densities equal to or greater than this value can be achieved with the prior art. Performance levels below 0.25 particles/cm$^2$ cannot be routinely achieved under the measurement conditions listed on page 8 with the prior art target materials.

COMPARATIVE EXAMPLE ONE

Figure 6A:
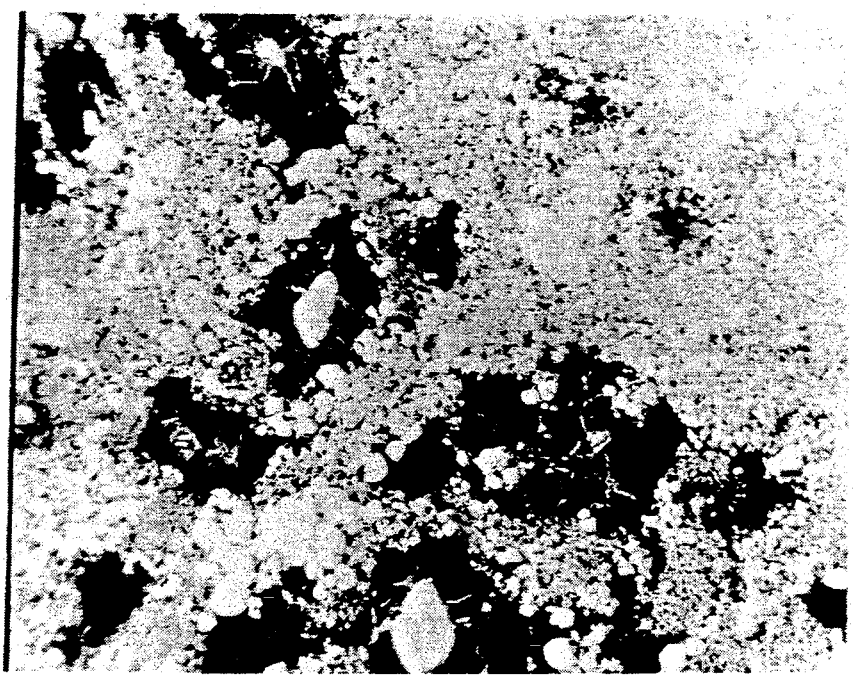
FIG. 6a is a 400× photomicrograph of a comparative example W-10 Ti target, prepared in accordance with the prior art.

A W-Ti target (10% wt. Ti) was manufactured by a HIPing process with a temperature of 1000° C., a compaction pressure of 100 MPa and a processing time of 120 minutes. FIG. 6a is a 400× photomicrograph of the resulting structure. This target is typical of the prior art W-Ti targets manufactured by the assignee of this invention, Tosoh SMD, Inc.

EXAMPLE 2

Figure 6B:
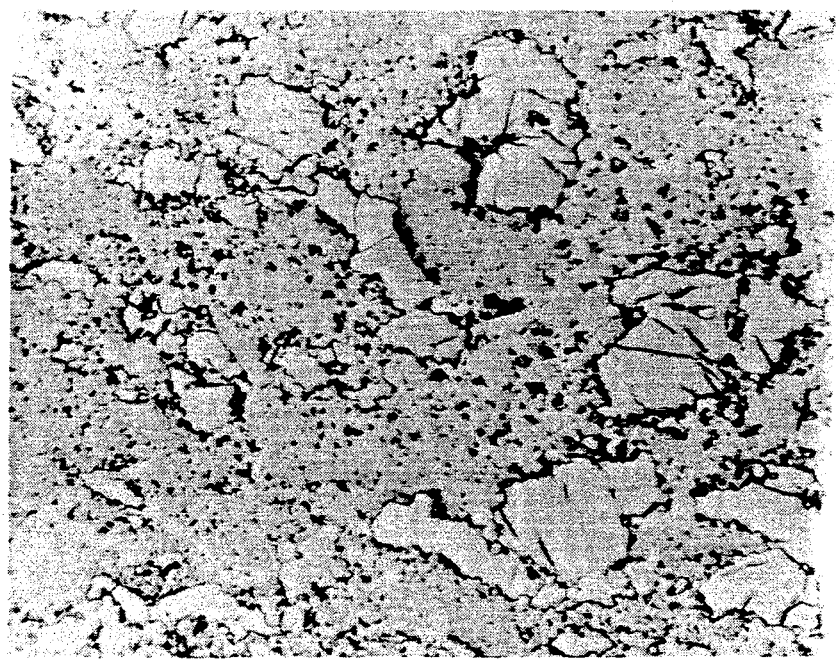
FIG. 6b is a 400× photomicrograph of a W-10 Ti target prepared in accordance with the invention.

A W-10% Ti sputtering target was manufactured by HIPing at a processing temperature of 775° C., a compaction pressure of 300 MPa and a processing time of 120 minutes. FIG. 6b is a 400× photomicrograph of the resulting structure.

As can be seen from comparison of FIGS. 6a and 6b, the black phase surrounding the white Ti grains in the comparative Example One photomicrograph is $\beta$(Ti,W) phase. In contrast, the Example Two photomicrograph (FIG. 6b) does not show formation of this undesirable $\beta$(Ti,W) phase.

Although it is clearly preferred to use the time, pressure and temperature conditions specified in Table I supra., to produce the reduced $\beta$(Ti,W) targets, other alterative methods of preventing the formation of $\beta$(Ti,W) can be practiced. Three alternative methods for limiting the formation of $\beta$(Ti,W) are presented. These methods include the use of diffusion barriers, the control of the time at temperature to limit $\beta$(Ti,W) formation, and the use of large Ti grains in the compact so the $\beta$(Ti,W) diffusion zone is a small fraction of the total Ti grain volume.

The first alternative method of preventing the formation of $\beta$(Ti,W) is by limiting interdiffusion of the Ti and W phases using diffusion barriers. We have found that the intentional addition of titanium dioxide (1 wt. % TiO$_2$) to the W-Ti powder blend prior to HIPing retards diffusion of W into the Ti phase and $\beta$(Ti,W)

formation. The addition of TiO$_2$ allows targets to be fabricated at temperatures of 1000° C. or more without forming measurable amounts of β(Ti,W) in the target. Targets so fabricated had low particle counts consistent with the relationship between volume % β(Ti,W) and particle emission. This method of reducing β(Ti,W) formation is not recommended, because it leads to poor W-Ti film properties and leads to early shield flaking.

Another method of limiting β(Ti,W) formation is by limiting the time that the target material is exposed to temperatures where significant interdiffusion can occur. This method is probably better than the first alternative method but is still not preferred. FIG. 3 shows the interdependence of processing time and temperature. The diffusion limit in FIG. 3 was calculated using a W into Ti diffusion coefficient, Do, of $3.6 \times 10^{-3}$ cm$^2$/sec and an activation energy, Q, of 183.9 KJ/mole[3].

[3] L.V. Pavlinov, Fiz. Metal. i Metalloved. 24, 272 (1967).

It is also important to note that even at temperatures below the monotectoid, β(Ti,W) is the stable terminal W-rich phase and can be formed by diffusing W into Ti. This means that lowering the temperature below the monotectoid does not necessarily prevent the formation of β(Ti,W). Long processing times at these lower temperatures can produce significant amounts of β(Ti,W). In order to form the W-rich terminal β(Ti,W) and the Ti rich β(Ti,W) phases shown in the phase diagram in FIG. 2, the interdiffusion between the αTi and the βW powder granules is required. Diffusion is a time and temperature dependent process where the size of the diffusion zone shown in FIG. 1 is approximated by $x = \sqrt{Dt}$, where x is the width of the β(Ti,W) diffusion zone, D is the diffusivity of W into Ti, and t is the time at elevated temperature. D is given by $D_o e^{-Q/RT}$ where $D_o$ is the diffusion coefficient of W into Ti, Q is the activation energy for diffusion, R is the gas constant and T is the processing temperature in Kelvin. So, limiting the time that the W-Ti compact is at elevated temperature will serve to reduce the amount of β(Ti,W) formed. However, lowering the processing temperature and time without increasing the compaction pressure will eventually lead to the production of W-Ti targets with densities below the desired value of more than 95% dense. In order to prevent the density from decreasing as the processing temperature and time are reduced, the compaction pressure can be increased. This is shown in FIG. 3 and in Table I.

Finally, the relative amount of β(Ti,W) formed in the W-Ti sputtering target can be limited to some extent by using large Ti powder grains. This alternative method can be illustrated by the following example. Consider two W-Ti powder compacts. In the first compact imagine a large number of small diameter Ti grains in a W matrix. In the second compact imagine a fewer number of large diameter Ti grains in a W matrix. In both cases, the total amount of Ti in the W matrix are equal. Expose both compacts to the same compaction pressure, time and temperature cycle. During this compaction cycle W will diffuse into the Ti grains forming β(Ti,W) in a diffusion zone with a thickness, x. When the diffusion zone width, x, is very small compared to the Ti grain radius, r, the amount of β(Ti,W) phase formed will be small. However, if x is equal to or greater than r, then a large percentage or all of the Ti will be transformed into the β(Ti,W) phase. For example, as the ratio x/r approaches a value of 0.03, the volume percent β(Ti,W) will approach 10%. At this point, particle emission due to the presence of β(Ti,W) in the target increases, as shown in FIG. 5. In addition, a measurable increase in brittleness of the W-Ti material will be observed.

This example illustrates that under identical conditions, a larger Ti grain diameter will be beneficial in limiting the amount of β(Ti,W) formed. A practical upper limit on the Ti grain diameter is 1 mm.

Various modifications may be made in the present invention without departing from the spirit of the invention or the scope of the appended claims.

We claim:

1. A method for preparing a tungsten-titanium sputter target having substantially no β(Ti, W) phase present and exhibiting improvement in reduction of particulate emission upon sputtering, comprising:
   (a) providing powders of said tungsten and titanium wherein said titanium powder is present in an amount of about 1-20 wt. % based on the total weight of said tungsten and titanium powders provided;
   (b) compacting said powders at a pressure of from about 200 to 1,000 MPa; and
   (c) heating said powders at a temperature from about 600°-882° C.

2. A method as recited in claim 1 wherein said steps (b) and (c) are conducted concurrently in a hot isostatic press.

3. A method as recited in claim 2 further comprising conducting said steps (b) and (c) concurrently for a period of from about 0.1-5 hours.

4. Method as recited in claim 1 comprising providing said titanium powder in a particle size range of between about 44-1,000 microns.

5. A method as recited in claim 1 wherein said step of compacting (b) comprises compacting said powders at a pressure of from about 200-400 MPa.

6. A method as recited in claim 3 wherein said steps (b) and (c) are conducted concurrently for a period of from 1-3 hrs.

7. A method as recited in claim 4 comprising providing said titanium powder in a particle size range of from about 100-300 microns.

8. A method as recited in claim 1 further comprising providing about 1 wt. % of TiO$_2$ to said tungsten and titanium powders.

9. A method for preparing a tungsten-titanium sputtering target having substantially no β(Ti, W) phase present and exhibiting improvement in reduction of particulate emission upon sputtering, comprising:
   (a) providing powders of said tungsten and titanium with the amount of said titanium powder provided being on the order of about 1-20 wt. % based on the total weight of said tungsten and titanium;
   (b) compacting said powders at a pressure of from about 200-400 MPa for a time and temperature given within region 102 shown in FIG. 3, said region being bounded by curves 100 and 112 and lines 106 and 110 of said FIG. 3.

10. A sputter target made by the method of claim 1.

11. A sputter target made by the method of claim 9.

12. A sputter target as recited in claim 10 consisting essentially of 10 wt. % titanium, remainder tungsten and having a density of at least about 95% of the theoretical density.

13. A sputter target as recited in claim 11 consisting essentially of 10 wt. % titanium, remainder tungsten and having a density of at least about 95% of the theoretical density.

14. Sputter target comprising from about 1-20 wt. % titanium, and tungsten, said target characterized by having a density of at least about 95% of the theoretical density and having substantially zero $\beta$(T,W) phase present.

15. Sputter target as recited in claim 14 having from trace to about 15% (by volume) $\beta$(Ti,W) present.

16. Sputter target as recited in claim 15 having from trace to about 12% (by volume) $\beta$(Ti,W) present.

17. Sputter target as recited in claim 15 having from trace to about 10% (by volume) $\beta$(Ti,W) present.

18. Sputter target comprising from about 1-20 wt. % titanium, and tungsten, said target having a density of about 95% of the theoretical density and having only trace amounts of $\beta$(Ti,W) phase present therein.

* * * * *